United States Patent
Tam et al.

(10) Patent No.: US 6,828,234 B2
(45) Date of Patent: Dec. 7, 2004

(54) RTP PROCESS CHAMBER PRESSURE CONTROL

(75) Inventors: Norman Tam, Sunnyvale, CA (US); Teresa Trowbridge, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 141 days.

(21) Appl. No.: 10/108,779

(22) Filed: Mar. 26, 2002

(65) Prior Publication Data

US 2003/0186554 A1 Oct. 2, 2003

(51) Int. Cl.[7] .............................................. H01L 21/44
(52) U.S. Cl. ..................................... 438/663; 438/513
(58) Field of Search .............................. 438/663, 513, 438/510, 522, 528, 529, 530, 475, 913, 914

(56) References Cited

U.S. PATENT DOCUMENTS

| | | | |
|---|---|---|---|
| 6,348,420 B1 * | 2/2002 | Raaijmakers et al. | 438/769 |
| 6,362,086 B2 * | 3/2002 | Weimer et al. | 438/591 |
| 6,544,900 B2 * | 4/2003 | Raaijmakers et al. | 438/769 |
| 6,596,595 B1 * | 7/2003 | Weimer et al. | 438/287 |

* cited by examiner

*Primary Examiner*—David Nhu
(74) *Attorney, Agent, or Firm*—Blakely Sokoloff Taylor & Zafman

(57) ABSTRACT

A method that includes flowing an inert gas into an interior of a single wafer process chamber to create a pressure in the interior that is greater than an ambient pressure; and maintaining the greater interior pressure during a wafer transfer with the single wafer process chamber.

18 Claims, 7 Drawing Sheets

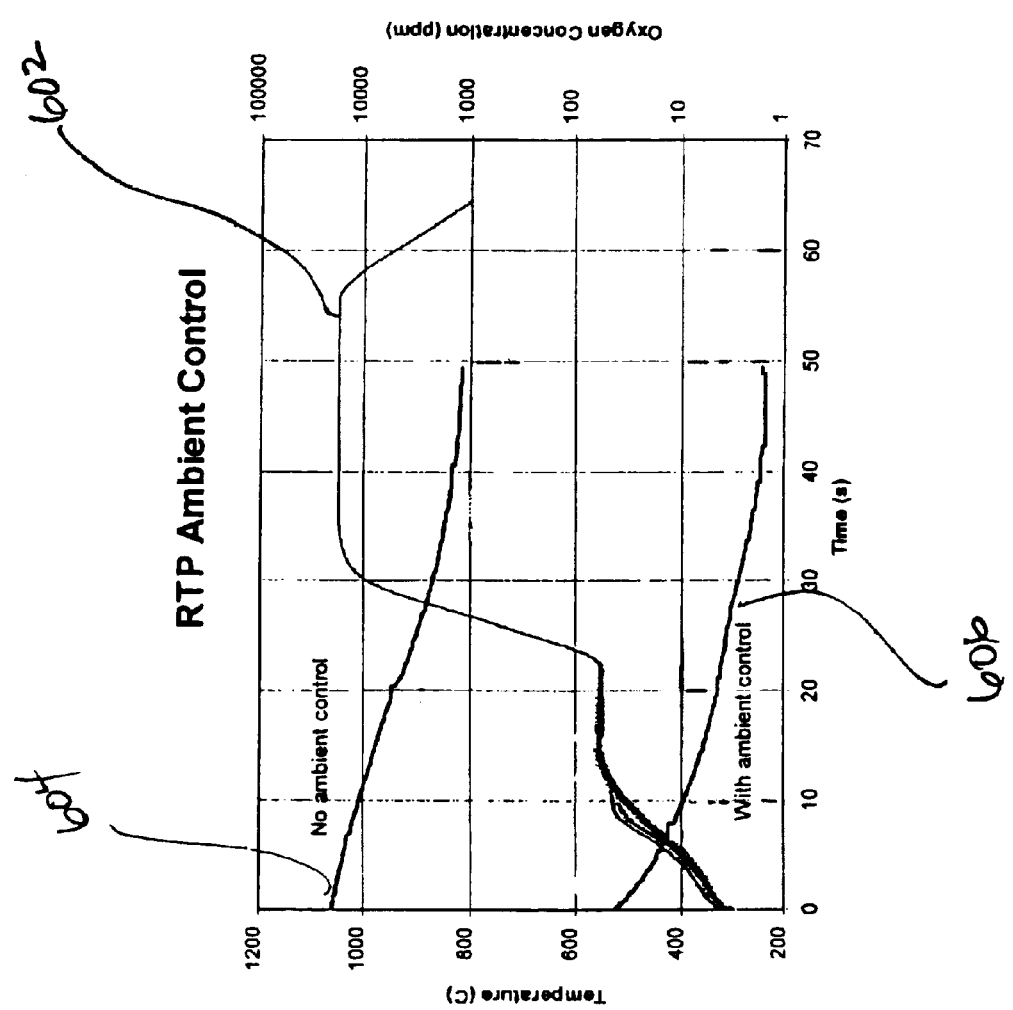

RTP PROCESS CHAMBER PRESSURE CONTROL

BACKGROUND OF THE INVENTION

1. Field of the Invention

The present invention relates generally to the field of semiconductor manufacturing. More specifically, the present invention relates to the process environment within a single wafer process chamber.

2. Description of the Related Art

Rapid Thermal Processing, commonly referred to as "RTP," subjects the wafer to a very brief, intense burst of heat that can go from room temperature to 1000° C. in seconds. This technology is used to change the characteristics of a deposited film or a crystal lattice. With the short, fast-ramping temperature cycling of RTP, variations among systems can potentially have a large impact on process results, which in turn can affect device speed and reliability. The most common use for an RTP chamber is for annealing, which activates and controls the movement of atoms in the device after implanting. Another common use is for silicidation, which uses heat to form silicon-containing compounds with metals such as tungsten or titanium. A third type of RTP application is oxidation, which involves growing oxide on the wafer.

Rapid Thermal Processing (RTP), a high-temperature technology, uses very rapid, precise heating to improve the properties of deposited films. RTP replaces conventional technologies that heat the wafer slowly in large batches.

Ion implantation provides precise control of electrical currents within specific layers of a semiconductor chip. An ion beam accelerates dopant ions in a way that permits them to penetrate the semiconductor's crystalline structure to a desired depth without damaging other sensitive circuitry on the wafer. Thermal annealing is the process that occurs after the implantation step in integrated circuit fabrication. Its function is to repair damage on silicon wafers and to activate implanted impurities.

As the industry moves to extremely short anneal times in advanced devices, the process of ramping up and cooling down account for a significant fraction of the total process time and thus control overall process results. The formation of ultra-shallow junctions, for example, requires precise, rapid (spike) implant anneals that limit high temperature exposure of the wafer to a few seconds. To enable these new device designs, the process chambers will require significant advancements in process control, even at high temperature ramp rates, for exceptional within-wafer uniformity and wafer-to-wafer repeatability.

Single wafer systems having fast wafer rotation (240 rpm) and a high speed (100 Hz), multi-point, closed-loop temperature control system provides tight temperature uniformity during ramps. Rapid ramp (250° C./s) and cool-down (90° C./s) rates limit thermal exposure of the wafer to less than 3 seconds above 950° C. for a 1050° C. spike anneal. Such process controls enable closed loop control at process temperatures below 280° C. for next-generation cobalt or nickel silicides. These new systems can be quickly qualified and calibrated, while process recipe setup, matching, and transfer are also much improved. Operators can tune the process and cut setup cost dramatically with the new system. Enhanced temperature uniformity across the wafer can improve yield by permitting better control of device parameters as well as gate oxide thickness and uniformity at sub-angstrom levels. Such control systems can feature integrated multi-point temperature measurement and emissivity compensation. These features improve overall temperature uniformity over the entire range of wafer backside emissivities; this is especially important where multiple types of devices are manufactured.

FIG. 1 is an illustration of a process chamber used for RTP. The process chamber, used for annealing and/or oxidation applications, can have problems with oxygen contamination from the atmosphere. To process wafers, for example, in a thermal process, a chamber is provided with a support ring to hold a wafer at the wafer edge, i.e. an edge ring. The edge ring can be configured to receive a wafer and the edge ring and wafer can be rotated by a quartz cylinder base. The reflector plate can be positioned beneath the edge ring to improve heating efficiency by providing a degree of black body absorption by the wafer. Fiber optic probes can measure wafer temperatures at different locations. The wafer is typically placed onto and removed from the edge ring by a robot blade and supported by the edge ring during processing. In typical prior art systems, the edge ring and the wafer are heated to a temperature of between 200–650° C. prior to processing by halogen lamps that are placed into a water-cooled housing and where the lamps are separated from the process area by thin quartz windows. Once the wafer is heated to an appropriate temperature, a processing gas is introduced into the chamber through a gas manifold often situated above the wafer. The processing gas can be inert or reactive, and if reactive, the gas can then react with the wafer surface.

A first goal of wafer processing is to obtain as many useful dies as possible from each wafer. Many factors affect the ultimate yield of die from each wafer processed. These factors include processing variables, which affect the uniformity and thickness of the material layer deposited on the wafer, and particulate and oxide contaminants that can attach to a wafer and contaminate one or more die. Both of these factors must be controlled in RTP and other processes to maximize the die yield from each wafer.

SUMMARY OF THE INVENTION

A method for reducing contaminates in the ambient atmosphere from flowing into the interior of an RTP single wafer process chamber during a wafer transfer. The method maintains positive pressure within the process chamber relative to atmospheric pressure by the flow an inert gas into the process chamber during the wafer transfer.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

FIG. 6 is an illustration of a graph of oxygen concentration in an RTP process chamber with and without ambient control.

DETAILED DESCRIPTION OF THE INVENTION

Rapid Thermal Processing (RTP) chambers can be used for such processes as annealing, silicidation, and oxidation of a wafer surface. To reduce equipment complexity and therefore cost, a wafer cartridge and a factory interface between the wafer cartridge and the process chamber may be exposed to ambient pressure. Disclosed herein is a method to minimize atmospheric impurities from entering a single wafer RTP chamber from the factory interface. Such impurities can contaminate wafers in later processing. During a wafer transfer, the interior of the chamber is maintained at a positive pressure relative to the pressure outside the chamber (ambient pressure), i.e. ambient control. With positive pressure maintained during the time the chamber is open for wafer transfer, gas can flow from the chamber interior to the exterior. This flow of gas from the chamber interior to the outside can prevent impurities from entering the chamber. Such impurities can be particles and/or gasses such as, for example, oxygen.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

In the present invention, positive pressure can be maintained within the RTP chamber during a wafer transfer by flowing an inert gas into the process chamber interior (the volume of space used for wafer processing) during the wafer transfer. Positive pressure provides a pressure higher within the single wafer process chamber interior (chamber interior) verses the ambient pressure, i.e. the pressure on the outside of the process chamber. As a result, when a wafer access door such as a slit valve is opened, gas can flow out of the process chamber interior and restrict the amount of external or ambient (atmospheric) gasses that can enter to contaminate the chamber interior.

This positive pressure can be accomplished with the flow of the inert gas into the interior that may begin just prior to opening the access door, with flow maintained during the placement or removal of a wafer. In addition, flow may continue for a time after the access door is again closed sealing the process chamber interior. The inert gas flow rate can be set to maintain positive pressure within the chamber interior by compensating for gas loss through the wafer access door during the opening/wafer transfer/closing sequence.

Figure 1:
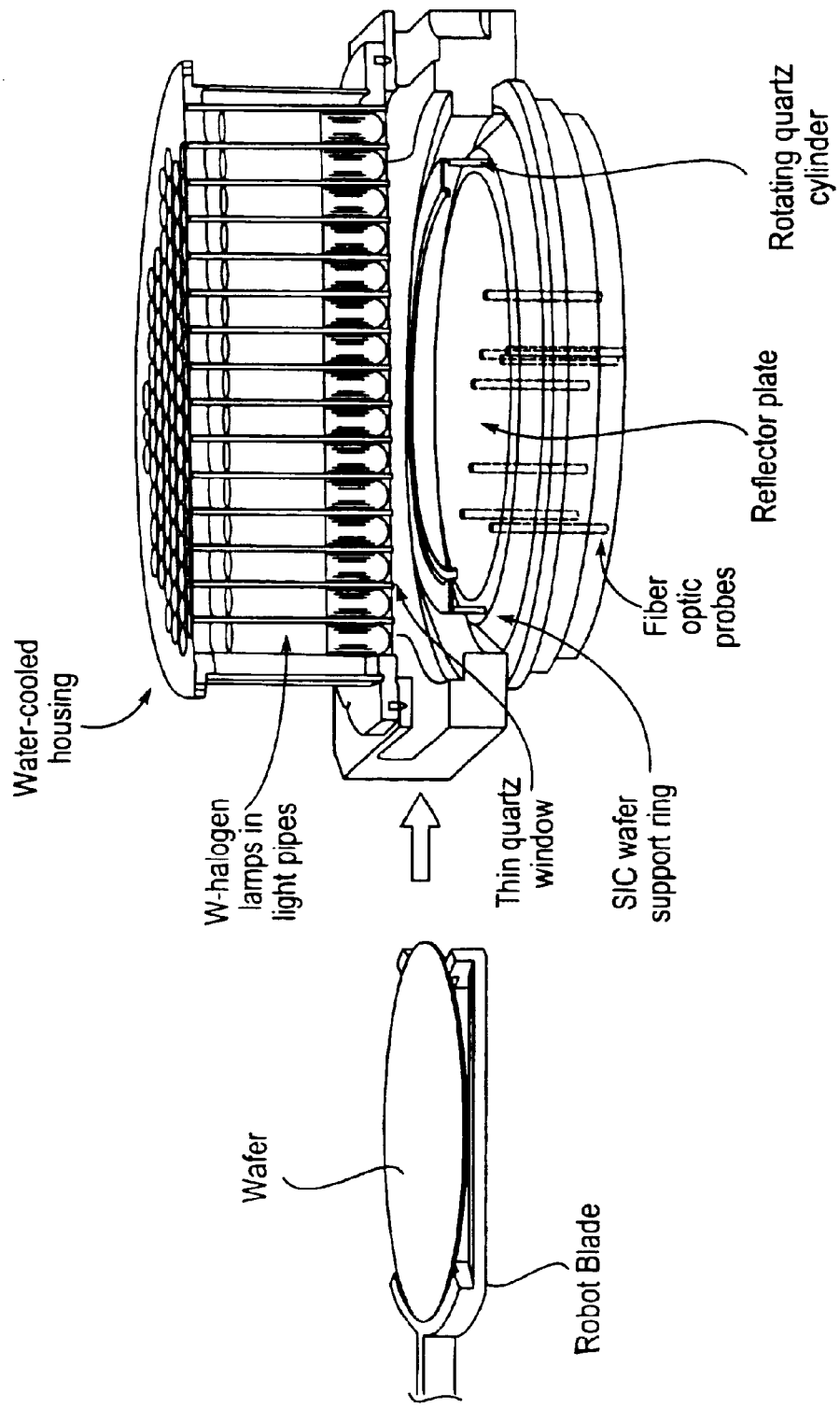
FIG. 1 is an illustration of an upper portion of an RTP chamber.
Figure 2A:
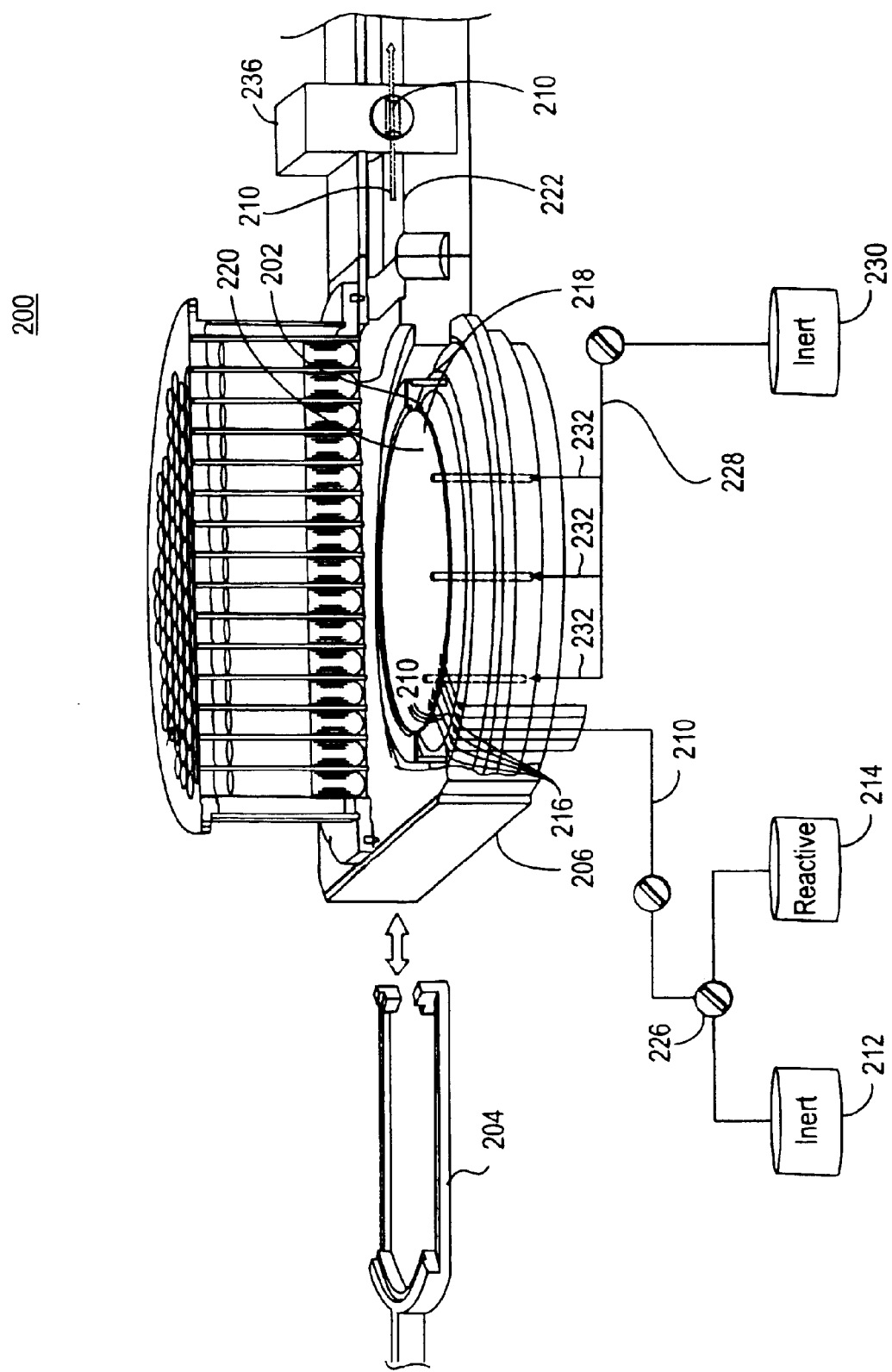
FIG. 2A. is an illustration of one embodiment of a single wafer process chamber for RTP with a closed slit valve and open exhaust valve.
Figure 2B:
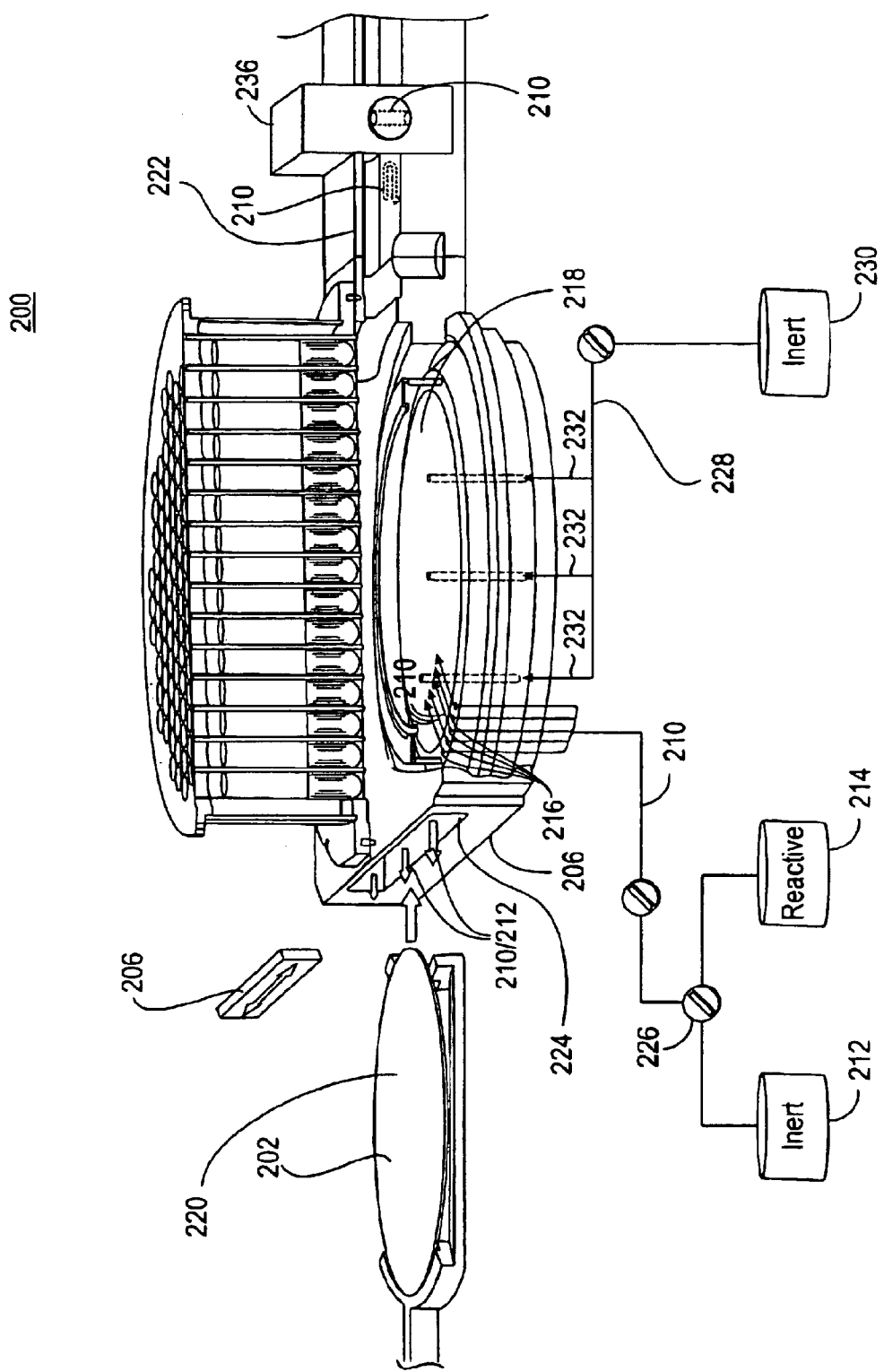
FIG. 2B is an illustration of the single wafer process chamber with an open slit valve and close exhaust valve.

FIGS. 2A and 2B are illustrations of an embodiment of the present invention, with a source of process and inert gases connecting to an interior of a single wafer process chamber. As shown in FIG. 2A, during processing of a wafer 202, the wafer 202 is placed into the process chamber 200 by a robot blade 204, the blade 204 then retracted, and the wafer access door 206 closed. After access door 206 closure, a process gas 210 can flow from an inert gas source 212 such as, for example, nitrogen (N2) or the process gas 210 can be a reactive gas 214 such as, for example, oxygen (O2). The process gas 210 can pass through several small ports 216 into the process chamber interior 218 to flow in a laminar fashion over the wafer top surface 220. After passing over the wafer top surface 220, the process gas 210 can continue to the opposite side of the process chamber interior 218 to exhaust through vent ducting 222. The vent ducting 222 can connect to a vacuum or low pressure source. Processing pressures within the process chamber 200, created by the gas 210, can be above, below, or at ambient pressure.

Referring to FIG. 2B, when the wafer access door 206 is open/opening, the external atmosphere can have a path of entry through a wafer transfer slit (slit) 224 into the chamber interior 218. If the process gas is inert 212, it can continue to flow during sequencing of the access door 206. Further, the flow rate of the inert gas (first inert gas) 212 can also be increased during sequencing of the access door 206. If the process gas 210 was a reactive gas 214 during wafer processing, the reactive gas 214 can be switched 226 off prior to opening the access door 206 and the first inert gas 212 turned on. However, the process gas 210 flow rate even if increased may not be sufficient to maintain positive pressure within the chamber interior 218 during wafer transfer.

To maintain positive pressure during access door 206 operation, flow of a second inert gas 228, from a second source 230, can add to the flow of first inert gas 210 to maintain the chamber interior 218 at a pressure above the external atmosphere (ambient). The second source 230 can port the second inert gas 228 into the process chamber 200 at one or more locations 232. Prior to or at the same time, an exhaust valve 236 can shut off the exhaust duct 222 normally used for venting the process gas 210. As a result, first inert gas 212 and second inert gas 228 can flow to the exterior through the slit 224 as opposed to atmosphere entering to contaminate the process chamber interior 218. In addition, positive pressure maintained during access door 206 open conditions can be used to vent atmosphere that has entered the chamber interior 218 when servicing the process chamber 200 such as to replace heating lamps.

Alternatively, the process gas 210 (either inert 212 or reactive 214) can be shut off at a valve 238 such that only the second inert gas 228 flows into the process chamber interior 218 during the time the access door 206 is open or opening. Further, it is possible to shut off the exhaust valve 236 and to begin flowing the second inert gas 228 prior to opening the access door 206 to build up pressure within the process chamber 200 and gain a head start on the loss of pressure caused by the open access door 206.

Figure 3:
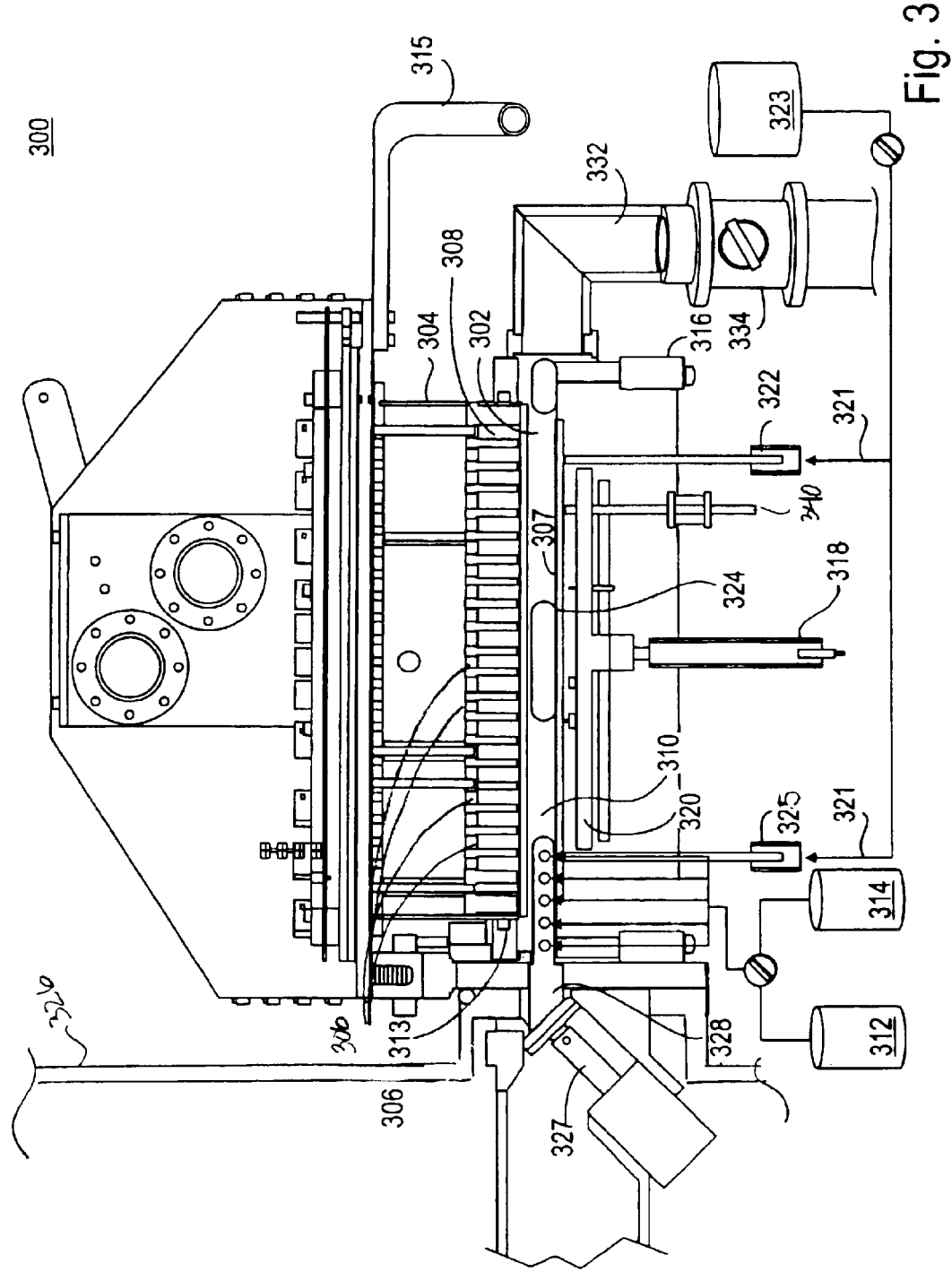
FIG. 3 is an illustration of an RTP single wafer process chamber.

FIG. 3 is an illustration of a cross-section of one embodiment of the present invention placed within a Rapid Thermal Processing (RTP) single wafer process chamber (RTP process chamber). The single wafer RTP chamber is a versatile, cold-wall, single wafer approach to semiconductor wafer processing that is suitable for several applications including annealing, cleaning, oxidation, and nitridation. As such, the RTP process chambers 300 can be configured for either toxic 314 (reactive) or non-toxic (inert) gas 312 delivery, depending on the nature of the wafer process used. In one embodiment, the single wafer process chamber 300 can be configured for processing at atmospheric pressure, however, alternate embodiments can process at above atmospheric pressure or at reduced atmospheric pressure. When the RTP process chamber 300 is configured for toxic gas 314 delivery, a first inert gas 312 delivery system can be included for alternate processing methods or for purposes of purging or assisting in the purge of the RTP process chamber interior 302. When the RTP process chamber 300 is integrated with a factory interface 326, the factory interface 326 can be configured for ambient pressure to operate at the same pressure as the RTP process chamber 300.

To reduce contamination of the RTP process chamber interior 302 by atmosphere during wafer transfer, connections 325 and 324 can be made to flow a second inert gas 321 such as nitrogen through the chamber interior 302 to exit the RTP process chamber 300 at a wafer transfer slit (slit) 328 during the wafer transfer. The connections 325 and 324 can be located in the bottom of the RTP process chamber interior 302 to flow up toward the slit 328 or the exhaust duct 332 providing increased purge efficiency.

To accomplish positive pressure during wafer transfer, the flow of process gasses, the first inert 312, and the second inert 323 gas can occur at different stages. At a point in processing a wafer, the cycle on a wafer 307 can be complete with the slit valve 327 still closed sealing the chamber interior 302. If a toxic gas 314 is used for processing, flow of this toxic gas 314 can cease and flow of the first inert gas 312 can begin for a period of time to vent the toxic gas 314 from the chamber through the exhaust system 332 which connects to a lower pressure reservoir (not shown). Alternatively, flow of the second inert gas 321 can purge the RTP process chamber interior 302 of toxic gas 314 through the exhaust valve 334 with or without aid from the first inert gas 312 source. After venting the toxic gas 314, the exhaust valve 334 can close and if not already flowing to aid in the purge, flow of the second inert gas 321 from a second source 323 can begin.

To reduce the time required to vent toxic gas from the chamber interior 310 through duct 332, additional venting (not shown) can be provided, such as, for example, within the factor interface 326. The additional venting can remove toxic gasses 314 escaping the chamber interior 310 during the time that the slit 328 is open to ambient.

Once the RTP process chamber interior 302 is vented (if toxic gas 314 is used), and the exhaust valve 334 closed, flow of the second inert gas 321 can continue until a pressure is achieved within the RTP process chamber interior 302. When the RTP process chamber interior 302 reaches a positive pressure that is approximately in the range of 1.05–1.10 times the ambient pressure, the slit valve 327 can open for wafer 307 removal or the addition of the next wafer to be processed. In an alternate embodiment, the RTP process chamber interior 302 can reach a positive pressure that is approximately in the range of 5–20 Torr pressure differential over ambient. When generating positive pressure for wafer transfer, flow of the first inert gas 312 can stop when flow of the second inert gas 321 begins or flow of the first inert gas 312 can continue so as to overlap and support the overall generation of positive pressure within the RTP process chamber interior 302. In an RTP process chamber, the slit 328 can have an opening approximately in the range of 10–20 in$^2$. To maintain positive pressure during wafer transfer a flow rate of a second inert gas of approximately in the range of 50–100 SLM (standard liters per second) may have to occur. If flow of a first inert gas is also used to maintained positive pressure, first inert gas flow can be at approximately 20 SLM during wafer transfer. Wafer processing temperatures for RTP can be in the range of approximately 300–1200° C. (i.e. wafer top surface temperature) while flow of the first inert gas 312 and/or the second inert gas 321 can be at ambient temperatures.

When a wafer transfer is complete and an unprocessed wafer is in the process chamber 300 with the slit valve 327 again closed, flow of the second inert gas 321 can cease and the exhaust valve 334 can re-open to begin the next wafer process cycle. However, as an extra precaution, after the slit valve 327 has sealed, flow of the second inert gas 321 can continue with the exhaust valve 334 open for a time as a purge to ensure that any contaminants reaching the RTP process chamber interior 302 from the ambient exterior are vented prior to starting the next cycle.

The RTP process chamber 300 can maintain a thermal environment in the process chamber interior 302 by a lamp module 304 which can be a nickel-plated copper/stainless steel structure that can house over 400 tungsten halogen lamps 306 where each bulb 306 can be rated at approximately 520 watts. Each bulb 306 can be placed in a separate tube 308 and each tube 308 can contain highly reflective sleeves (not shown) that can be gold plated. The lamps 306, which can be alternatively turned on and off to present a variety of heating arrays, can provide uniform heating onto a wafer 307 when arranged within the lamp module 304 in a pattern such as a hexagonal pattern.

A low-mass quartz window 310 can cover the lamps 306 and when the lamp module 304 is closed, an O-ring 313 can make a seal between the RTP process chamber interior 302 and the lamp module 304. The lamp module 304 can pivot on a set of hinges (not shown) such as by a force applied to a handle 315 and where the lamp module 304 can be opened for maintenance. Fifteen software controlled heat zones (not shown) can individually monitor by sampling approximately 100 times per second to ensure optimal temperature control at all points. These heat zones can be generated by varying voltage to the heat lamps 306 in an order to create a variety of patterns of heating that can change during the process. Water can circulate through the lamp module 304 to cool the lamps 306 and improve lamp 306 lifetime.

Multiple temperature probes IR (infra-red) 318 can feed information into a digital signal, which can be relayed to a remote temperature controller (RTC) (not shown). The RTC can convert the received light energy to the digital signal, which can then convert the measured energy into temperature. The RTC can compare the actual temperature to a setpoint and direct an increase, decrease, or no change to the output of all, a group of, or a single temperature zone. Thus, the RTP single wafer process chamber 300 can have a closed loop temperature control system, which can consist of a number of probes 318, a reflector plate 320, an RTC for controlling the heating zones, and approximately 410 lamps for the heating zones. The probes 318 can be arranged radially from the center of the reflector plate 320 and data from the probes 318 can be relayed to the RTC which can adjust power output to the lamps 306 to control the temperature.

The single wafer process chamber 300 temperature sensors 318 can be approximately seven distributed pyrometers that correspond to the 15 zones for the lamps 306. These probes 318 can be made of high purity quartz light pipes connected directly to the pyrometer electronics. Temperature sensors 318 in the single wafer process chamber 300 can be referred to as temperature probes, pyrometers, or thermometers. These sensors 318 detect radiated energy and convert this energy to an electrical signal, which represents the amount of energy detected. Within the process chamber 300 this energy is characterized as heat and the energy measured corresponds to temperature. Although the wafer 307 can reach temperatures of approximately 1100° C., the temperature interior 302 can be kept cool by active cooling systems (not shown). Each probe 318 sampling rate can be approximately 100 times per second where each probe 318 takes an infrared (IR) "snapshot" of a portion of the process area 302 and where the control unit calculates a temperature from these snapshots.

The chamber bottom assembly 316 can contain the wafer edge ring 324 and where the bottom assembly 316 and the wafer edge ring 324 can be made of SiC (silicon carbide) ceramic. The aluminum reflector plate 320 and a wafer transfer chamber 326 are fastened to the bottom of the chamber bottom 316. There can be in and out ports (not shown) for flowing water through the chamber bottom 316 to perform the active cooling. Two gas ports 325 and 324, for flowing inert gas into the process chamber 310, can be placed in the lower chamber area under the wafer edge ring 324. Instead of the simpler wafer access door 206 shown above (FIGS. 2A & 2B), a slit valve 327 that opens and closes the slit 328 can be located at the front of the process chamber 300 and can be a part of the transfer chamber 326.

The wafer edge ring 324 can be composed of silicon carbide (SiC), which is approximately 16 mils (0.016 inch) thick. To form the wafer edge ring 324, the SiC can be deposited via chemical vapor deposition (CVD) onto a graphite form that is later machined off. The wafer edge ring 324 can then be coated with a layer of silicon that is approximately 100 $\mu$m thick. The wafer edge ring 324 has this silicon coating in order to absorb any incident lamp light and to behave as a classic blackbody.

Overall, the wafer edge ring 324 has about the same thickness as a wafer, but has different a thermal behavior. Materials for the wafer edge ring 324 can be chosen for high strength and high purity, which can enable them to withstand very high temperatures and not provide impurities into the process chamber interior 310. With the use of the wafer holding ring 324, nearly the entire backside of the wafer 307 is exposed to the reflector plate 320 and temperature probes 318 mounted below. A further result of material selection, the wafer 307 will not stick to the wafer holding ring 324 during processing.

A wafer rotation assembly consists of a magnetically coupled rotation drive (not shown) with a rotor, a controller (not shown), positioning sensors (not shown), and a signal conditioner (not shown). A rotation speed of 240 RPM is normal for process. The speed of the rotation assists uniform heat distribution and process results. With this system, the rotor (not shown) makes no mechanical contact to the chamber bottom 316 while the controller levitates the rotor. The controller regulates the speed of rotation with an analog voltage from the voltage supply. The rotor is fitted with four posts with O-rings, which receive the quartz cylinder. The wafer holding ring 324 rests on the quartz cylinder. This design isolates the internal and external portions of the rotation assembly to prevent particulate contamination of the process chamber interior 320. The advantage to a magnetically coupled rotation is that there is no particulate generation caused by a direct drive shaft, bushings, or bearings.

The single wafer process chamber includes a wafer lift assembly 340 that is a precision mechanism with three magnetically coupled lift pin assemblies (not shown) containing the lift pins, which are fire polished quartz rods. The wafer lift assembly 340 is pneumatically raised and lowered, with magnetic position sensors. The wafer lift assembly 340 has two positions, up and down. The robot (not shown) moves the wafer 307 from the transfer chamber 326 into the process chamber 302. The lift pins rise to lift the wafer 307 off the robot blade (not shown). After the robot blade is retracted the lift lowers the wafer 307 onto the wafer holding ring 324. After processing, the lift pins raise the wafer 307 allowing robot removal.

The typical gasses for RTP processing are nitrogen ($N_2$), oxygen ($O_2$), and argon (Ar). Typical process gas flow rates are 15.0 liter/min to 3 liter/min for ion implant anneal and titanium silicidation, 15.0 liter/min to 3 liter/min for rapid thermal oxidation, and 15.0 liter/min to 3.0 liter/min for spike annealing. A gas panel (not shown) supplies inert purge and process gasses to the chamber interior 320. Because each gas panel is built to customer specifications, there is no standard configuration. What follows is a basic description of a gas panel and how the gas will flow to the chamber. A mainframe supports modular gas panels; therefore, each chamber has its own gas panel. The gas panel is located beside the chamber, allowing easy access. Single wafer process chamber gas panel configurations can consist of the following components: stainless steel tubing VCR fittings, manual shut-off valve at the facilities connection, Mass Flow Controller (MFC), a final valve (last valve before gas leaves gas panel for the chamber), N/C manifold for process gasses with a single final valve, and N/O manifold for purge gasses, where the N/O manifold will provide purge gas to the chamber in the event of an emergency situation since some wafer processes require gases that are toxic and/or corrosive.

Figure 4:
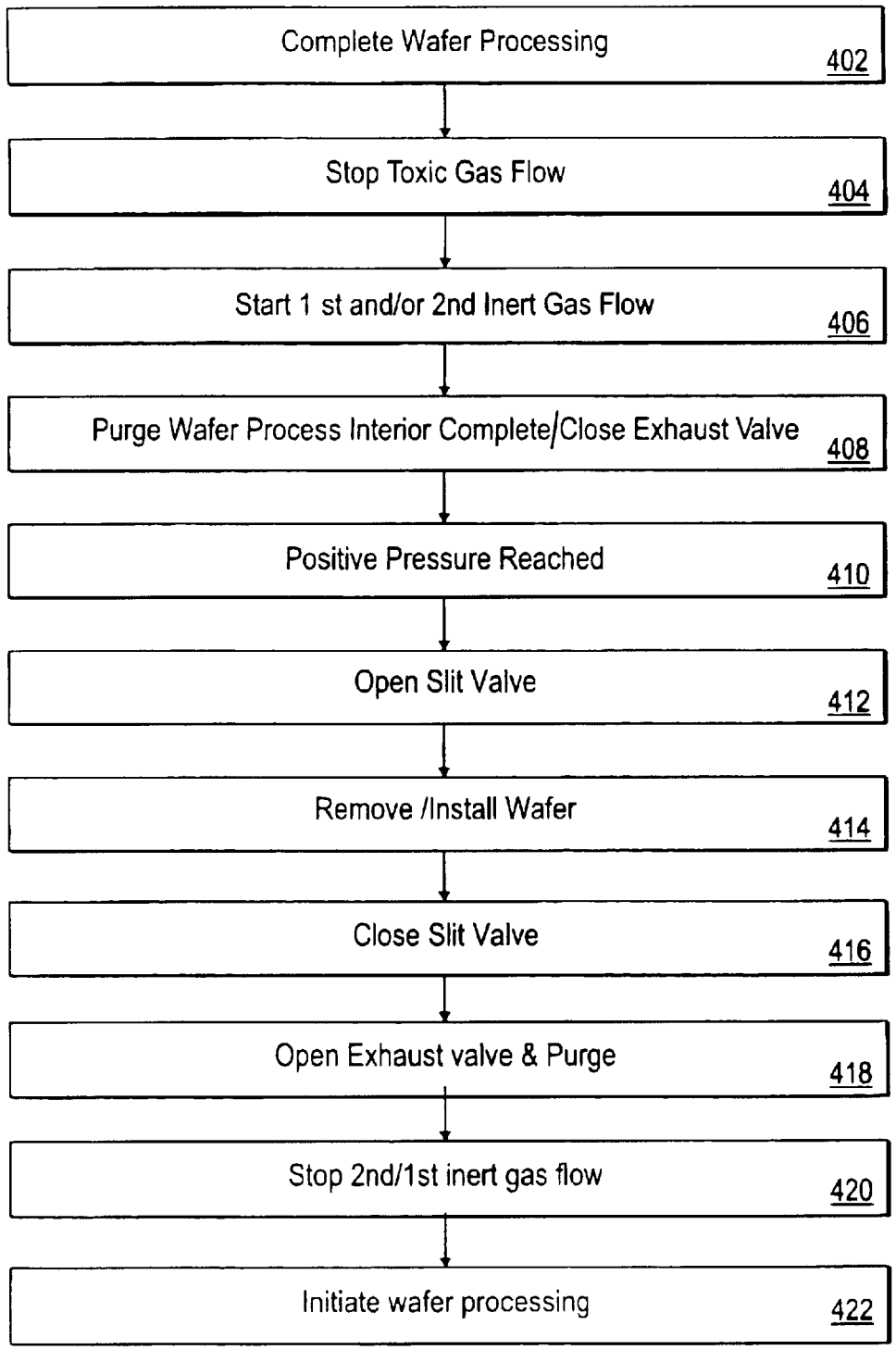
FIG. 4 is a flow diagram of one embodiment of an method for maintaining positive pressure during wafer transfer.

FIG. 4 is a flow diagram of one embodiment of a method for maintaining positive pressure during a wafer transfer. Processing can be completed on a wafer installed within the single wafer process chamber 402. At this point, if a toxic gas was used as the process gas, flow of the toxic gas can be stopped 404. If an inert gas is used as the process gas (first inert gas), it can continue and/or a second inert gas can flow into the process chamber interior to purge any remaining toxic gas from the process chamber, after which the exhaust valve is shut closing off the exhaust vent 408. First inert gas and/or second inert gas can continue to flow until a pressure above ambient is reached 410. Next, the slit valve can be opened 412 and the wafer removed, or alternatively, another wafer can placed into the wafer process chamber 414. Wafer removal can require the slit valve to be open for approximately 4–5 seconds with the same approximate time needed for new wafer installation. While the slit valve is open, the inert gas within the process chamber can exit through the slit to atmosphere, which is at a lower pressure. After wafer transfer is complete, the slit valve is closed 416. Next, the exhaust duct is re-opened to allow for purging of the process chamber interior by the continued flow of inert gas 418. After the purge is complete, flow of the second inert gas can cease. If a toxic gas is used as the process gas, flow of the first inert gas can cease 420. Finally, the wafer process can begin on the newly installed wafer 422.

Figure 5:
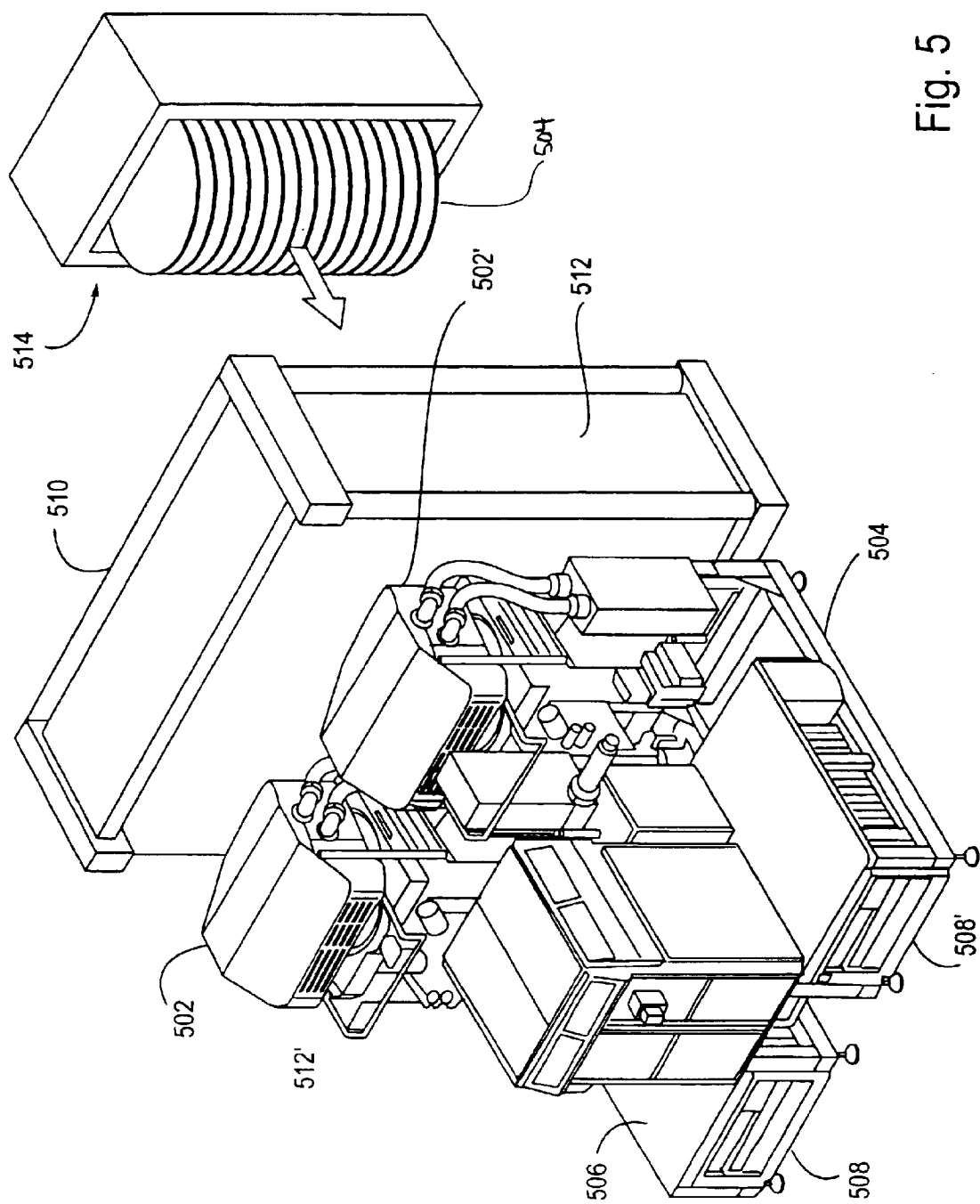
FIG. 5 is an illustration of a cluster of two RTP process chambers.

FIG. 5 is an illustration of a cluster of two RTP single wafer process chambers. Two or more RTP single wafer process chambers 502 and 502' can be placed on a common frame 504 to gain the benefit of a common location for temperature controllers 506, electronics controls 508 and 508', an in-process factory interface unit 510, electrical wiring 512 and 512' for the lamps (not shown), ventilation systems (not shown), and piping from a gas panel (not shown). The in-process factory interface unit 510 can be connected to cartridges of wafers 514 where the cartridges 514 can contain both processed and to be processed. The individual wafers 504 can be transferred into each RTP single wafer process chamber by a robot arm (not shown) and the wafer cartridges 514 can be added and removed automatically as well. The factory interface 510 can be enclosed to provide a clean environment for robot movement and wafer handling and where the pressure within the in-process wafer storage unit 510 can be set at the fabrication environment, i.e. no pressure control.

It is to be further appreciated that the order of flowing inert gas from the first and the second sources can be modified to meet the needs of rapid thermal processing. Either the first inert gas or the second inert gas flow can overlap flow from the other to support purge and venting operations. In addition, gas flow rates and the pressures they maintain within the single wafer process chamber, the times required to flow the inert gasses, and the setup for input and exhausting the gasses can also be modified to meet these process requirements.

FIG. 6 is a graph that illustrates the effectiveness of maintaining positive pressure over the ambient pressure during wafer transfer (ambient control). The graph illustrates several curves as a function of time. The first curve 602 illustrates the temperature within an RTP single wafer process chamber during a wafer process. The second curve 604 illustrates the oxygen concentration over time in the process chamber during processing of a wafer when no positive pressure is maintained in the process chamber during wafer transfer. The third curve 606 illustrates the oxygen concentration over time during a wafer process cycle when positive pressure has been maintained during wafer transfer. A comparison of the two curves 604 and 606 illustrates a large reduction in oxygen contamination within the wafer process chamber that can result from maintaining a positive pressure within the process chamber relative to ambient pressure during the wafer transfer operation.

Thus a method for maintaining an environment of positive pressure within a single wafer processing chamber has been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method, comprising:
    flowing an inert gas into an interior of a single wafer process chamber to create a pressure in the interior that is greater than an ambient pressure; and
    maintaining the greater interior pressure during a wafer transfer with the single wafer process chamber.

2. A method, comprising: flowing an inert gas into an interior of a single wafer process chamber to create a pressure in the interior that is greater than an ambient pressure; and maintaining the greater interior pressure during a wafer transfer with the single wafer process chamber, and flowing the inert gas out of the interior wherein the net gain of the inert gas flow through the interior maintains the interior pressure at greater than ambient pressure during the wafer transfer.

3. The method of claim 1, wherein the inert gas is chosen from the group consisting of nitrogen, argon, and helium.

4. The method of claim 1, wherein a wafer transfer is accomplished in less than 5 seconds.

5. The method of claim 1, wherein the inert gas flows out of the interior trough a slit.

6. The method of claim 1, wherein a first inert gas flows into the interior from a first inert gas source.

7. The method of claim 1, wherein a second inert gas flows into the interior from a second inert gas source.

8. The method of claim 1, wherein the interior chamber pressure is maintained by an inert gas flow in the range of approximately 5–20 Torr greater than the ambient pressure.

9. The method of claim 1, wherein the second inert gas flows into the interior from one or more inlet ports located in the lower portion of the wafer process chamber interior.

10. The method of claim 9, wherein the second inert flows around the wafer prior to an exhaust duct to purge the wafer process chamber interior.

11. The method of claim 1, wherein the second inert gas flows into the wafer process chamber interior at an ambient temperature.

12. The method of claim 1, wherein wafer processing temperatures within the interior are in the range of approximately 300–1200° C.

13. A method for single wafer processing, comprising:
    placing a wafer into a single wafer process chamber;
    opening an exhaust valve;
    flowing a process gas into the single wafer process chamber;
    stopping the process gas flow;
    flowing an inert gas into the single wafer process chamber;
    closing the exhaust valve;
    opening a slit valve;
    transferring the wafer out of the single wafer process chamber;
    closing the slit valve;
    opening the slit valve;
    placing a next wafer into the single wafer process chamber;
    closing the slit valve;
    opening the exhaust valve; and
    stopping the inert gas flow, wherein during wafer transfer, positive pressure is maintained within the single wafer process chamber.

14. The method of claim 13, wherein the inert gas source from the second source flows for approximately 5 seconds after the wafer access door is enclosed.

15. The method of claim 13, wherein the process gas is a first inert gas from a first source.

16. The method of claim 13, wherein the process gas is a reactive gas.

17. The method of claim 15, wherein the inert gas is a second inert gas from a second source.

18. The method of claim 17, wherein flow of the first inert gas can and flow of the second inert gas can overlap.

* * * * *